(12) United States Patent
Shakuda

(10) Patent No.: US 8,101,963 B2
(45) Date of Patent: Jan. 24, 2012

(54) SEMICONDUCTOR LIGHT EMITTING ELEMENT AND METHOD FOR MANUFACTURING SAME

(75) Inventor: Yukio Shakuda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 378 days.

(21) Appl. No.: 12/307,193

(22) PCT Filed: Jul. 3, 2007

(86) PCT No.: PCT/JP2007/063291
§ 371 (c)(1),
(2), (4) Date: Dec. 31, 2008

(87) PCT Pub. No.: WO2008/004545
PCT Pub. Date: Jan. 10, 2008

(65) Prior Publication Data
US 2009/0256170 A1      Oct. 15, 2009

(30) Foreign Application Priority Data
Jul. 4, 2006   (JP) ................................. 2006-184331

(51) Int. Cl.
*H01L 33/00*  (2010.01)
*H01L 31/0224*  (2006.01)
(52) U.S. Cl. ........... 257/99; 257/E33.066; 257/E21.066; 438/22
(58) Field of Classification Search .................... 257/99, 257/E33.066, E21.159, E21.066; 438/22
See application file for complete search history.

(56) References Cited

U.S. PATENT DOCUMENTS

| | | | |
|---|---|---|---|
| 6,670,647 B1 * | 12/2003 | Yamasaki et al. | 257/99 |
| 6,838,701 B2 | 1/2005 | Sano | |
| 6,969,873 B2 * | 11/2005 | Hata et al. | 257/94 |
| RE40,163 E * | 3/2008 | Hori et al. | 257/79 |
| 7,439,552 B2 * | 10/2008 | Takigawa et al. | 257/98 |
| 7,452,740 B2 | 11/2008 | Kamei | |
| 7,537,944 B2 | 5/2009 | Kobayakawa | |
| 7,605,403 B2 * | 10/2009 | Horio et al. | 257/91 |
| 2002/0105004 A1* | 8/2002 | Hori et al. | 257/99 |
| 2004/0251471 A1* | 12/2004 | Dwilinski et al. | 257/103 |
| 2005/0226297 A1* | 10/2005 | Lin et al. | 372/46.014 |
| 2006/0151802 A1* | 7/2006 | Tsuchiya et al. | 257/99 |

(Continued)

FOREIGN PATENT DOCUMENTS

JP         9-55536       2/1997

(Continued)

*Primary Examiner* — Allan R Wilson
(74) *Attorney, Agent, or Firm* — Hamre, Schumann, Mueller & Larson, P.C.

(57) ABSTRACT

A semiconductor light emitter (A) includes an n-type semiconductor layer (2), a p-type semiconductor layer (4), and an active layer (3) between these two layers (2, 4). The light emitter (A) further includes an n-side electrode (5) on the n-type layer (2) and a p-side electrode (6) on the p-type layer (4). An insulating layer (7) covers the n-type and p-type layers (2),(4), while also partially covering the n-side and p-side electrodes (5),(6), leaving part of the electrodes (5, 6) exposed. The n-side electrode (5) has a first Al layer (51) formed on the n-type layer (2) and a second Ni, W, Zr or Pt layer (52) formed on the first layer (51). The p-side electrode (6) has a first Au layer (61) formed on the p-type layer (4), and a second Ni, W, Zr or Pt layer (62) formed on the first layer (61).

2 Claims, 10 Drawing Sheets

U.S. PATENT DOCUMENTS

| | | |
|---|---|---|
| 2006/0163589 A1 * | 7/2006 | Fan et al. .................. 257/88 |
| 2008/0315237 A1 | 12/2008 | Kamei et al. |
| 2009/0001401 A1 * | 1/2009 | Park et al. .................. 257/99 |

FOREIGN PATENT DOCUMENTS

| | | |
|---|---|---|
| JP | 9-63962 | 3/1997 |
| JP | 9-69668 | 3/1997 |
| JP | 2000-12846 | 1/2000 |
| JP | 2003-243773 | 8/2003 |
| TW | 1257715 | 7/2006 |
| TW | 1257716 | 7/2006 |
| TW | 1257721 | 7/2006 |
| WO | 01/61804 | 8/2001 |

* cited by examiner

SEMICONDUCTOR LIGHT EMITTING ELEMENT AND METHOD FOR MANUFACTURING SAME

TECHNICAL FIELD

The present invention relates to a semiconductor light emitting element and a method for manufacturing the same.

BACKGROUND ART

Semiconductor lasers or light emitting diodes are examples of conventional semiconductor light emitting elements (see e.g. Patent Document 1 below). Semiconductor light emitting elements can provide in general high luminance with less power consumption, thereby making a suitable light source for a liquid crystal display device, for example.
Patent Document 1: JP-A-2003-243773

FIG. 10 shows a conventional semiconductor light emitting element. The illustrated light emitting element X includes a substrate 101, on which an n-GaN layer 102, an active layer 103 and a p-GaN layer 104 are laminated. The n-GaN layer 102 and the p-GaN layer 104 are covered by an insulating layer 107. The insulating layer 107 is made of e.g. $SiO_2$ and formed with two openings 107a. The openings 107a expose part of the n-GaN layer 102 and p-GaN layer 104. A wiring 108 is connected to each of the n-GaN layer 102 and the p-GaN layer 104 via the opening 107a. The wiring 108 includes an Ni layer 108a contacting the n-GaN layer 102 or the p-GaN layer 104, and an Au layer 108b formed on the Ni layer 108.

The light emitting element X has the following problems. In manufacturing the light emitting element X, the openings 107a are formed by etching the insulating layer covering the n-GaN layer 102 and the p-GaN layer 104. This etching damages the n-GaN layer 102 and the p-GaN layer 104. As a result, the electrical resistance at the interface between each of these layers and the wiring 108 increases, so that the drive voltage of the light emitting element X becomes unduly high.

As one of the measures against this problem, it may be considered to form a relay electrode (not shown) made of e.g. Au in each of the openings 107a and then form the wiring 108. In this case, good electrical conduction is expected to be established between the n-GaN layer 102 or the p-GaN layer 104 and the wiring 108 by the relay electrode.

However, this arrangement causes another problem. That is, when the wiring 108 is formed at a high ambient temperature, Au may diffuse from the relay electrode into the insulating layer 107. As a result, at least part of the insulating layer 107 becomes conductive, which increases the leakage current.

DISCLOSURE OF THE INVENTION

The present invention has been proposed under the circumstances described above. It is, therefore, an object of the present invention to provide a semiconductor light emitting element which is capable of preventing an increase in drive voltage and suppressing leakage current.

According to a first aspect of the present invention, there is provided a semiconductor light emitting element comprising an n-type semiconductor layer, a p-type semiconductor layer, an active layer disposed between the n-type semiconductor layer and the p-type semiconductor layer, an n-side electrode contacting the n-type semiconductor layer, a p-side electrode contacting the p-type semiconductor layer, and an insulating layer covering the n-type semiconductor layer and the p-type semiconductor layer in a manner such that part of the n-side electrode and part of the p-side electrode is exposed. The n-side electrode comprises a first layer made of Al and contacting the n-type semiconductor layer, and a second layer formed on the first layer and made of any one of Ni, W, Zr and Pt. The p-side electrode comprises a first layer made of Au and contacting the p-type semiconductor layer, and a second layer formed on the first layer and made of any one of Ni, W, Zr and Pt.

This arrangement provides the following technical effects. In the process of etching the insulating layer after the n-side electrode and the p-side electrode are formed, only the second layer of each electrode is subjected to the etching. Since the second layer is made of Ni, W, Zr or Pt, the surface is not considerably damaged by the etching. Thus, the resistance at the interface between each electrode and the member electrically connected to the electrode is relatively low. Thus, the semiconductor light emitting element can be driven at a relatively low voltage. Further, in each of the electrodes, the upper surface of the first layer can be entirely covered by the second layer. In this case, of each electrode, the portion which is in contact with the insulating layer mostly comprises the second layer. (For instance, this state can be provided by making the first layer appropriately thin.) Ni, W, Zr or Pt which forms the second layer is unlikely to diffuse into the insulating layer, as compared with Au. Thus, the insulating layer 7 does not unduly become conductive, whereby leakage current in the semiconductor light emitting element is prevented.

Preferably, the semiconductor light emitting element further comprises a wiring contacting the n-side electrode (or the p-side electrode). The wiring includes a first layer, and a second layer formed on the first layer. The first layer of the wiring is in contact with the second layer of the n-side electrode (or the p-side electrode) and made of the same material as that of the second layer of the n-side electrode (or the p-side electrode). The second layer of the wiring is made of Au. With this arrangement, the n-side electrode or the p-side electrode and the wiring are bonded to each other at the portions made of the same material. With this arrangement, the resistance at the interface between each electrode and the wiring is lower as compared with the structure in which different kinds of metals are bonded to each other.

According to a second aspect of the present invention, there is provided a method for manufacturing a semiconductor light emitting element comprising an n-type semiconductor layer, a p-type semiconductor layer, and an active layer disposed between the n-type semiconductor layer and the p-type semiconductor layer. The method comprises the steps of forming an n-side electrode in contact with the n-type semiconductor layer, forming a p-side electrode in contact with the p-type semiconductor layer, forming an insulating layer covering the n-type semiconductor layer, the p-type semiconductor layer, the n-side electrode and the p-side electrode, and etching the insulating layer to expose part of the n-side electrode and part of the p-side electrode. The formation of the n-side electrode is performed by forming a first layer of Al on the n-type semiconductor layer and forming a second layer of any one of Ni, W, Zr and Pt on the first layer. The formation of the p-side electrode is performed by forming a first layer of Au on the p-type semiconductor layer and forming a second layer of any one of Ni, W, Zr and Pt on the first layer.

With this arrangement, only the second layer of each of the n-side electrode and the p-side electrode is subjected to etching. Since the second layer is made of Ni, W, Zr or Pt, the surface is not considerably damaged by the etching. Thus, the resistance at the interface between each of the n-side electrode and the p-side electrode and the member electrically connected to the electrode is relatively low. This makes it possible to drive the semiconductor light emitting element at a relatively low voltage.

Other features and advantages of the present invention will become more apparent from the detailed description given below with reference to the accompanying drawings.

BEST MODE FOR CARRYING OUT THE INVENTION

Preferred embodiments of the present invention will be described below with reference to the accompanying drawings.

Figure 1:
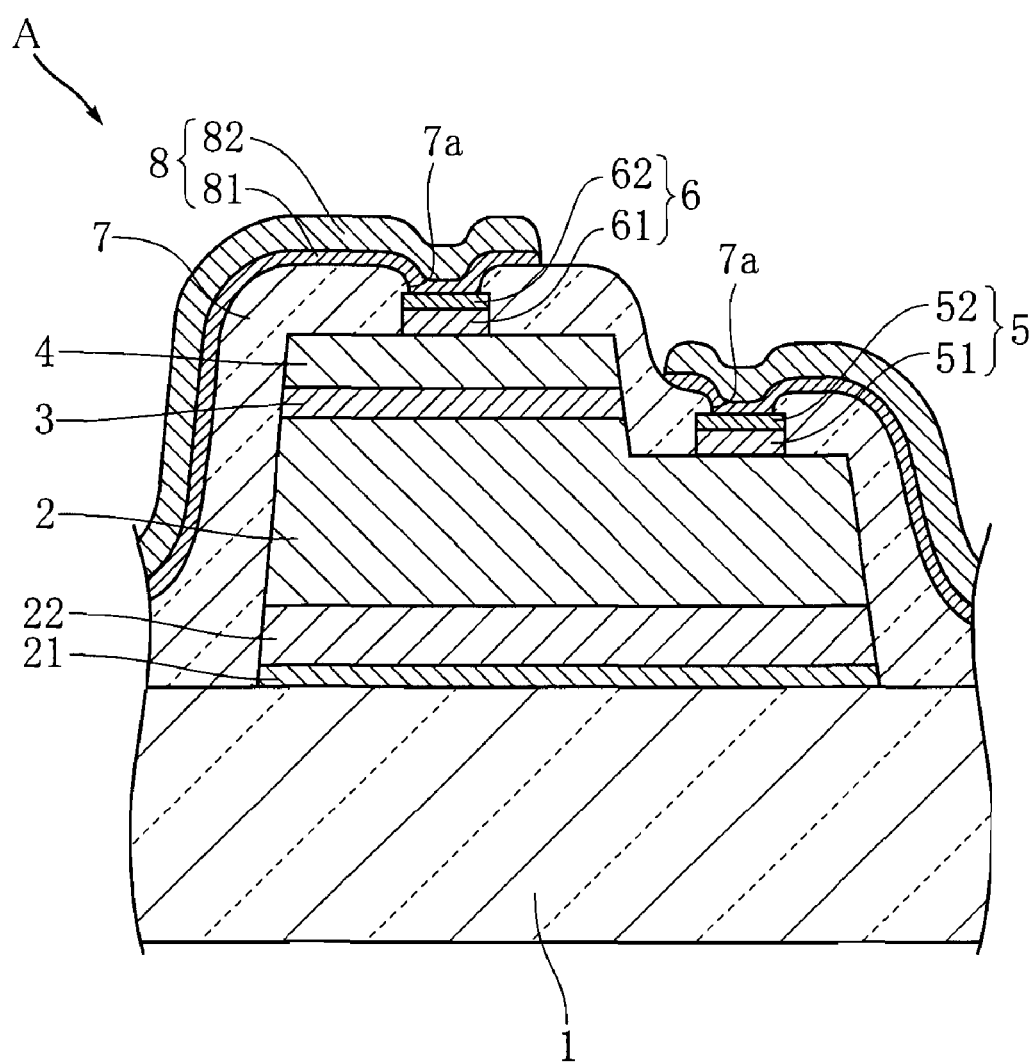
FIG. 1 is a sectional view showing a principal portion of an example of semiconductor light emitting element according to the present invention.

FIG. 1 shows an example of semiconductor light emitting element according to the present invention. The illustrated semiconductor light emitting element A is formed on a substrate 1 and includes an n-GaN layer 2, an active layer 3, a p-GaN layer 4, an n-side electrode 5, a p-side electrode 6, an insulating layer 7 and a wiring 8. The semiconductor light emitting element A is designed to emit light through the insulating layer 7.

The substrate 1 is made of e.g. sapphire and supports the n-GaN layer 2, the active layer 3, the p-GaN layer 4 and so on. The substrate 1 has a thickness of e.g. about 350 μm.

The n-GaN layer 2 is a layer formed by doping Si into GaN. The n-GaN layer 2 has a thickness of e.g. about 3.5 μm. A buffer layer 21 and an undoped GaN layer 22 are laminated between the substrate 1 and the n-GaN layer 2. The buffer layer 21 and the undoped GaN layer 22 serve to alleviate lattice deformation between the substrate 1 and the n-GaN layer 2. The thicknesses of the buffer layer 21 and the undoped GaN layer 22 are about 0.05 μm and 2.0 μm, respectively.

The active layer 3 has a multiple quantum well (MQW) structure. In the active layer 3, electrons and holes are recombined to emit light, and the light is amplified. In this process, the electrons are supplied from the n-side electrode 5, whereas the holes are supplied from the p-side electrode 6. The active layer 3 is made up of a plurality of InGaN layers and a plurality of GaN layers which are alternately laminated. The In composition ratio in each of the InGaN layers is e.g. about 15%. Thus, the band gap of the InGaN layer is smaller than that of the n-GaN layer 2, so that the InGaN layer functions as a well layer of the active layer 3. Each of the GaN layers is a barrier layer of the active layer 3. The number of the InGaN layers and the GaN layers constituting the active layer 3 is in the range of 3 to 7, for example. The active layer 3 has a thickness of e.g. about 0.1 μm.

The p-GaN layer 4 is a layer formed by doping Mg into GaN. The p-GaN layer 4 has a thickness of e.g. about 0.1 μm.

The n-side electrode 5 is formed on the n-GaN layer 2. The n-side electrode 5 serves to supply electrons to the active layer 3 and has a laminated structure made up of an Al layer (first layer) 51 and an Ni layer (second layer) 52. The Al layer 51 is in contact with the n-GaN layer 2 and has a thickness of about 4000 Å. The Ni layer 52 is formed on the Al layer 51 and has a thickness of about 500 Å. Instead of the Ni layer 52, a layer made of W, Zr or Pt may be employed as the second layer.

The p-side electrode 6 is formed on the p-GaN layer 4. The p-side electrode 6 serves to supply holes to the active layer 3 and is made up of an Au layer (first layer) 61 and an Ni layer (second layer) 62. The Au layer 61 is in contact with the p-GaN layer 4 and has a thickness of about 4000 Å. The Ni layer 62 is formed on the Au layer 61 and has a thickness of about 500 Å. Preferably, the Ni layer 62 covers the entirety of the upper surface of the Au layer 61. Instead of the Ni layer 62, a layer made of W, Zr or Pt may be employed as the second layer. In the present invention, it is preferable that the second layer of the n-side electrode 5 and the second layer of the p-side electrode 6 are made of the same material.

The insulating layer 7 is made of e.g. $SiO_2$ and covers the n-GaN layer 2 and the p-GaN layer 4. The insulating layer 7 is formed with two openings 7a. The n-side electrode 5 or the p-side electrode 6 is provided in each of the openings 7a, so that the upper surface of each electrode is exposed at the insulating layer 7.

The wiring 8 is provided for electrically connecting the semiconductor light emitting element A to an adjacent semiconductor light emitting element or non-illustrated terminal, for example. The wiring 8 is made up of an Ni layer (first layer) 81 and an Au layer (second layer) 82. The Ni layer 81 is in contact with the Ni layer 52 of the n-side electrode 5 or the Ni layer 62 of the p-side electrode 6 and made of the same material as that of the Ni layers 52, 62. The Au layer 82 is formed on the Ni layer 81. The thicknesses of the Ni layer 81 and the Au layer 82 are about 500 Å and 8000 Å, respectively. It is preferable that the material of the first layer of the wiring 8 is the same as that of the second layer of the p-side electrode 5 or n-side electrode 6 which is in contact with the wiring.

A method for manufacturing the semiconductor light emitting element A will be described below with reference to FIGS. 2-5.

Figure 2:
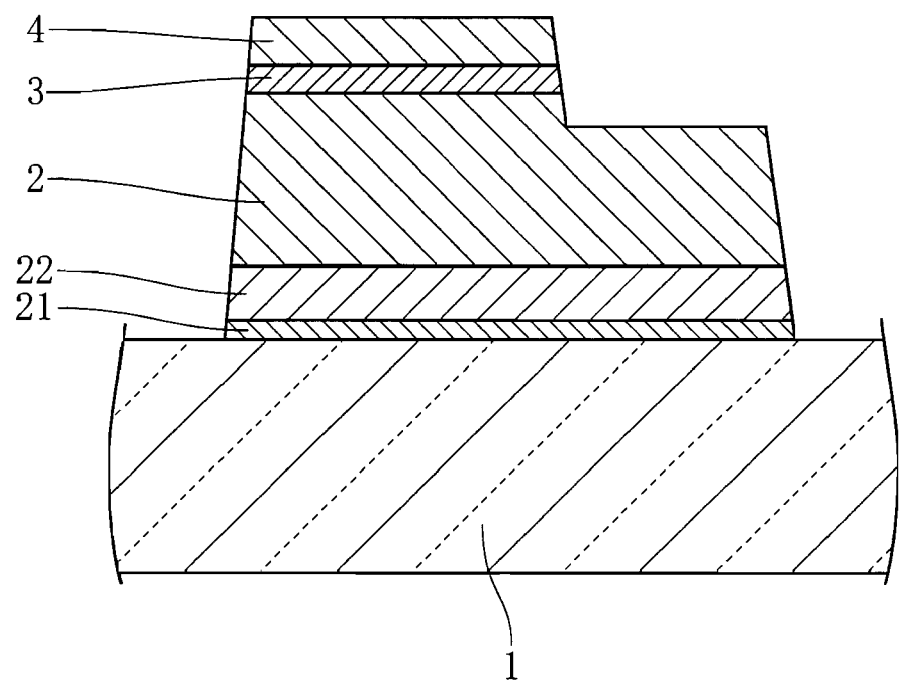
FIG. 2 is a sectional view showing the state in which semiconductor layers are laminated on a substrate in a process step of a method for manufacturing the semiconductor light emitting element.

First, as shown in FIG. 2, a buffer layer 21, an undoped GaN layer 22, an n-GaN layer 2, an active layer 3 and a p-GaN layer 4 are laminated on a substrate 1. For instance, these layers are formed by metal-organic chemical vapor deposition (MOCVD).

Figure 3:
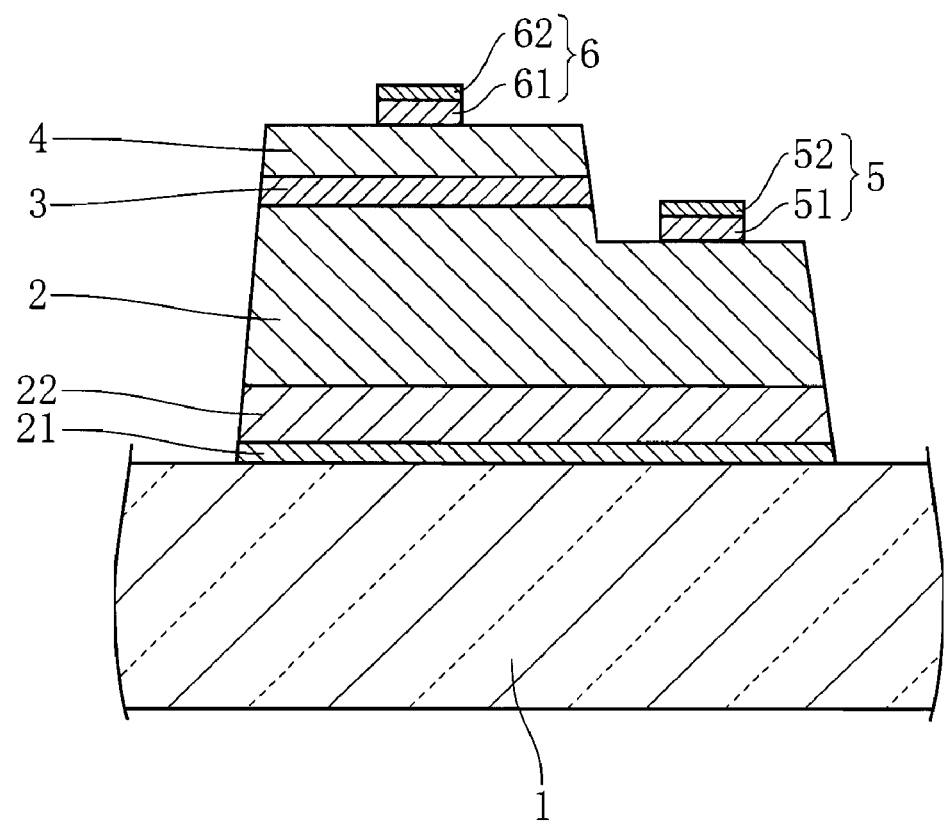
FIG. 3 is a sectional view showing the state in which an n-side electrode and a p-side electrode are formed in a process step of the method for manufacturing the semiconductor light emitting element.

Then, as shown in FIG. 3, an n-side electrode 5 and a p-side electrode 6 are formed. Specifically, an Al layer 51, an Au layer 61 and Ni layers 52, 53 are formed by e.g. vapor deposition and lift-off. In this process, the Al layer 51 and the Au layer 61 are formed to have a thickness of 4000 Å, whereas the Ni layers 52, 53 are formed to have a thickness of 500 Å.

Figure 4:
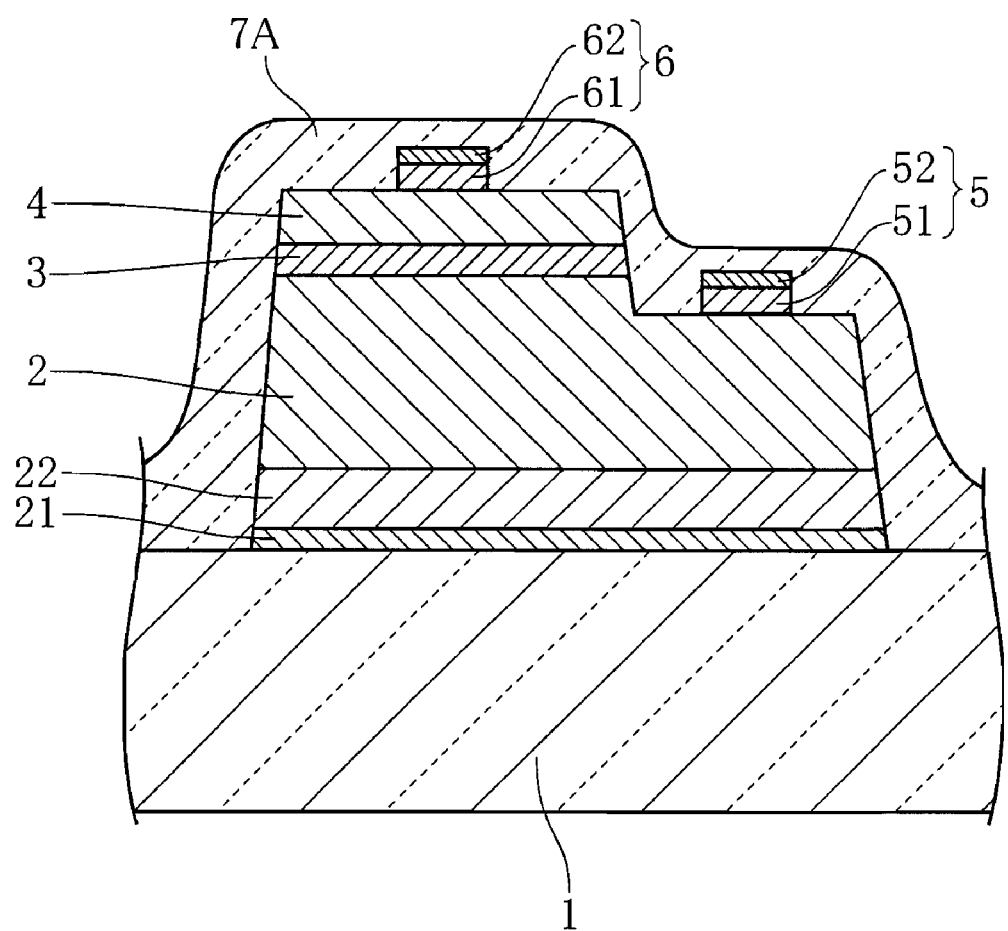
FIG. 4 is a sectional view showing the state in which an insulating layer is formed in a process step of the method for manufacturing the semiconductor light emitting element.

Then, as shown in FIG. 4, an insulating layer 7A is formed to cover the n-GaN layer 2, the p-GaN layer 4, the n-side electrode 5 and the p-side electrode 6. Specifically, the insulating layer 7A is formed by vapor deposition using $SiO_2$, for example.

Figure 5:
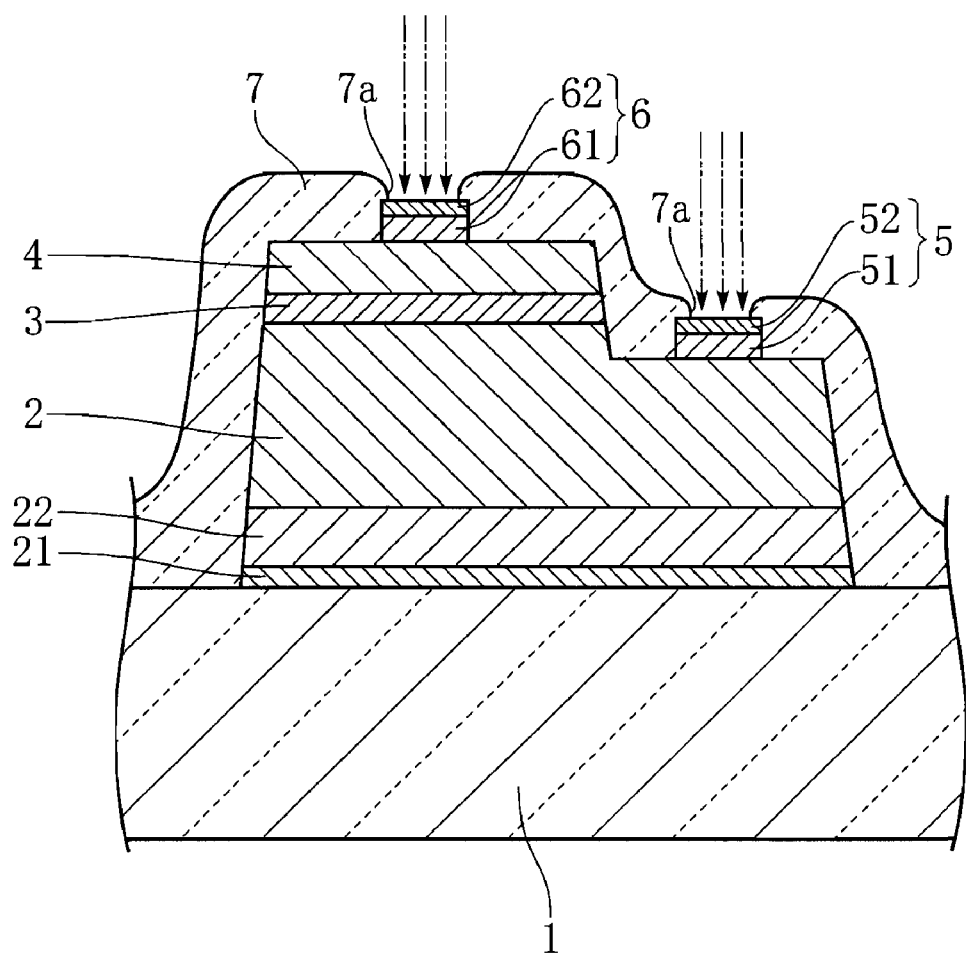
FIG. 5 is a sectional view showing a process step of etching the insulating layer in the method for manufacturing the semiconductor light emitting element.

Then, as shown in FIG. 5, two openings 7a are formed by etching the insulating layer 7A via a mask (not shown) formed by e.g. photolithography. This etching may be ion etching. Specifically, for example, the ion etching is performed by supplying $CF_4$ as the etching gas at the flow rate of 40 sccm (volume flow rate (cc=$cm^3$) per minute in a standard state) under the pressure of about 3.0 Pa and at a high frequency power of about 100 W. By forming the two openings 7a, the Ni layer 52 of the n-side electrode 5 and the Ni layer 62 of the p-side electrode 6 are exposed. Thus, the formation of the insulating layer 7 is completed.

Thereafter, a wiring 8 having a laminated structure made up of an Ni layer 81 with a thickness of about 500 Å and an Au layer 82 with a thickness of about 8000 Å is formed by e.g. vapor deposition and lift-off. Thus, the semiconductor light emitting element A is obtained.

The advantages of the semiconductor light emitting element A will be described below.

Figure 6:
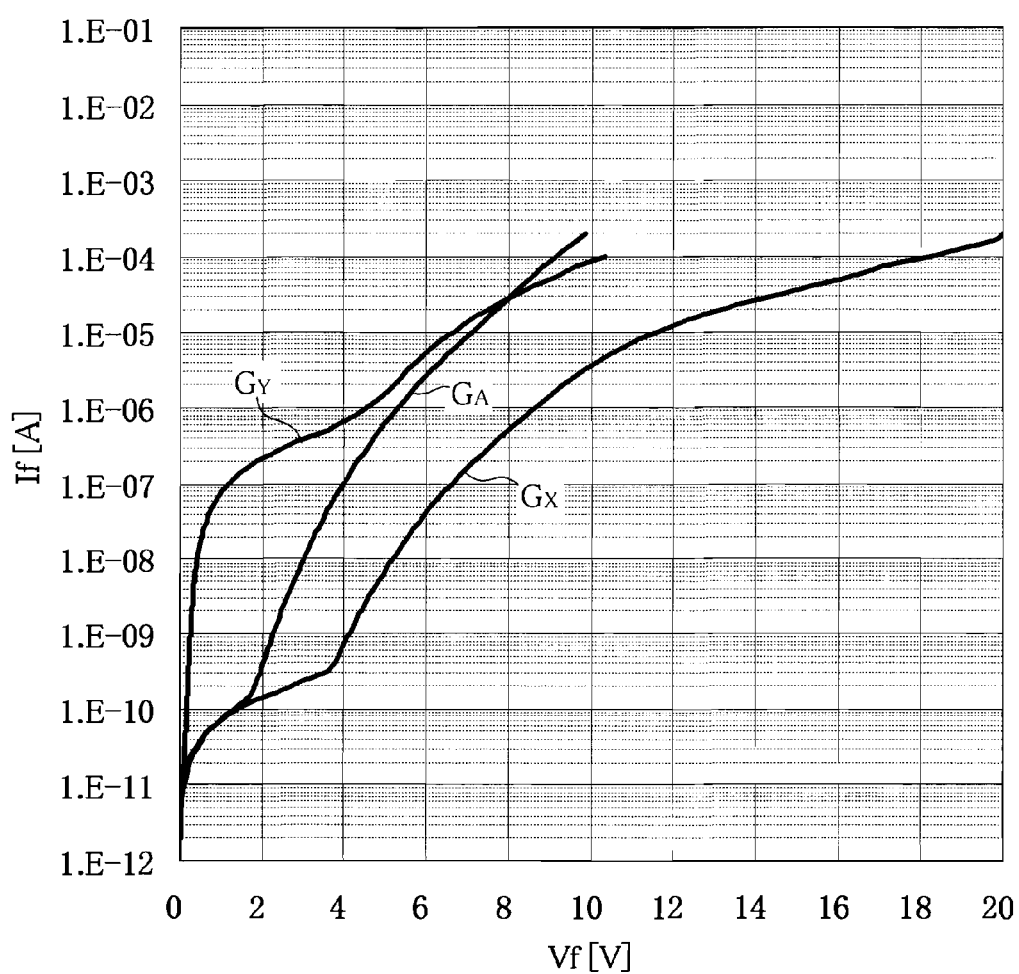
FIG. 6 is a graph showing the forward voltage-current characteristic of the semiconductor light emitting element shown in FIG. 1 and comparative examples 1, 2.

FIG. 6 shows the forward current If relative to the forward voltage Vf, which was measured with respect to the semiconductor light emitting element A and comparative examples 1, 2. In this figure, the graph $G_A$ indicates the measurements of the semiconductor light emitting element A, whereas the graphs $G_X$ and $G_Y$ indicate the measurements of the comparative example 1 and the comparative example 2, respectively. The structure of the comparative example 1 is the same as that of the semiconductor light emitting element X shown in FIG. 10. The structure of the comparative example 2 is basically similar to that of the comparative example 1 (semiconductor light emitting element X) but differs from the comparative example 1 in that a relay electrode is provided in each of the openings 107a. Each of the relay electrodes has a two-layer structure made up of a lower layer made of Ni and an upper layer made of Au. The lower layer is in contact with the layer 102 or 104 of the semiconductor light emitting element X, whereas the upper layer is in contact with the wiring 108.

Figure 10:
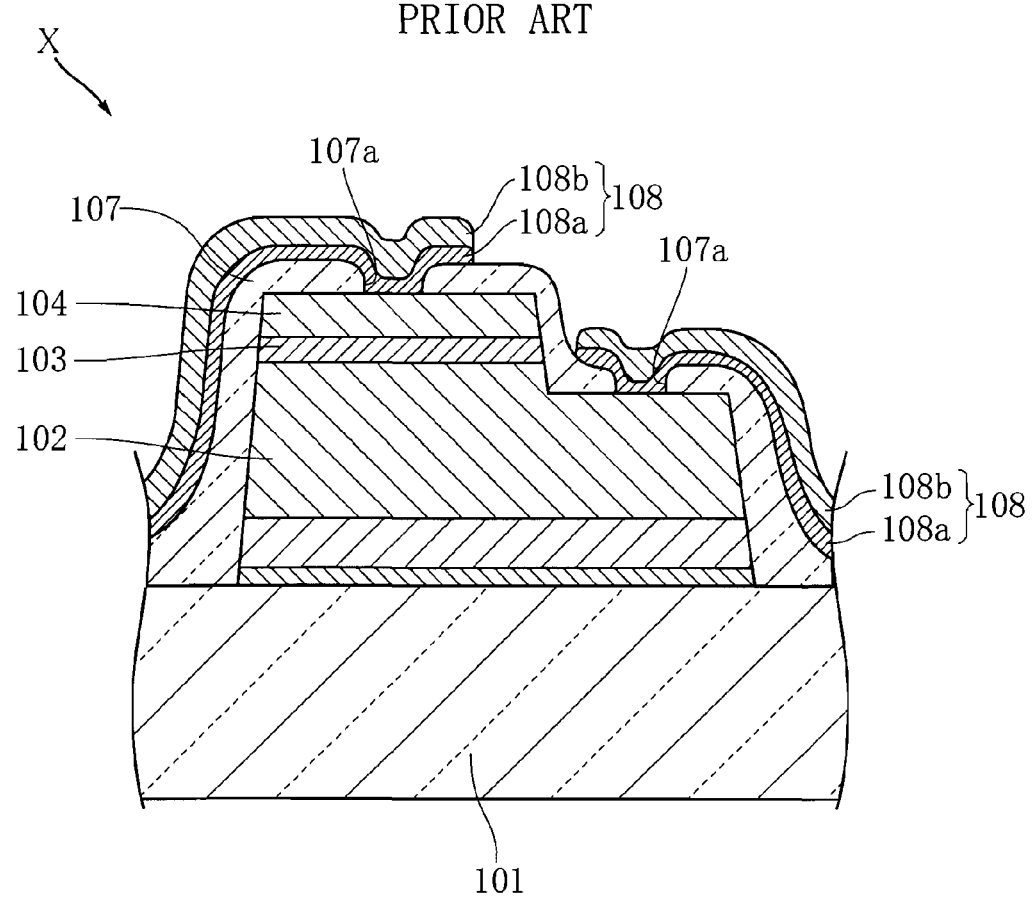
FIG. 10 is a sectional view showing a principal portion of a conventional semiconductor light emitting element.

First, the graph $G_A$ (semiconductor light emitting element A) and the graph $G_X$ (comparative example 1) will be compared. For instance, to obtain the forward current If of about $1.0 \times 10^{-5}$ A, which is a standard for achieving proper light emission in industrial use, the comparative example 1 requires the forward voltage Vf of about 12V. As compared to this, the semiconductor light emitting element of the present invention, only requires the forward voltage Vf of about 7V. That is, according to the present invention, the drive voltage can be reduced as compared with the comparative example 1. The reason for this is considered to be as follows. As shown in FIG. 10, in the comparative example 1, the wiring 108 is directly bonded to the n-GaN layer 102 and the p-GaN layer 104. Generally, the openings 107a provided at the location of this bonding are formed by etching the insulating layer 107. By this etching process, the surfaces of the n-GaN layer 102 and p-GaN layer 104 are damaged. Since the wiring 8 is formed on the damaged surfaces, the electrical resistance at the interface between each of the n-GaN layer 102 and the p-GaN layer 104 and the wiring 108 is relatively high. As a result, a high drive voltage is required. On the other hand, as will be understood from FIG. 5, the n-GaN layer 2 and the p-GaN layer 4 of the present invention are not subjected to etching. Further, although the Ni layers 52 and 62 are subjected to etching, the etching speed is relatively low, so that the surfaces are unlikely to be damaged. As a result, the drive voltage of the semiconductor light emitting element A is relatively low.

Next, the graph $G_A$ (semiconductor light emitting element A) and the graph $G_Y$ (comparative example 2) will be compared. In the comparative example 2, the forward current If of about $1.0 \times 10^{-7}$ A flows even at a relatively low forward voltage Vf of not more than 1.0 V. By the studies performed by the inventors, it has been found that this current is leakage current and hardly contributes to the light emission in the active layer 103 (see FIG. 10). The cause of the leakage current is considered to be as follows. As noted before, in the comparative example 2, a relay electrode is provided in each opening 107a, and the upper layer of the relay electrode is made of Au. Au diffuses into the insulating layer 107 at a temperature of about 600° C. As a result, part of the insulating layer 107 becomes conductive, whereby leakage current flows. Unlike this, of the n-side electrode 5 and the p-side electrode 6 of the semiconductor light emitting element A, the portions which are in contact with the insulating layer 7 are mostly the Ni layers 52 and 62. Ni is unlikely to diffuse into the insulating layer 7 made of $SiO_2$. Thus, the insulating layer 7 does not unduly become conductive, whereby leakage current is prevented.

Figure 7:
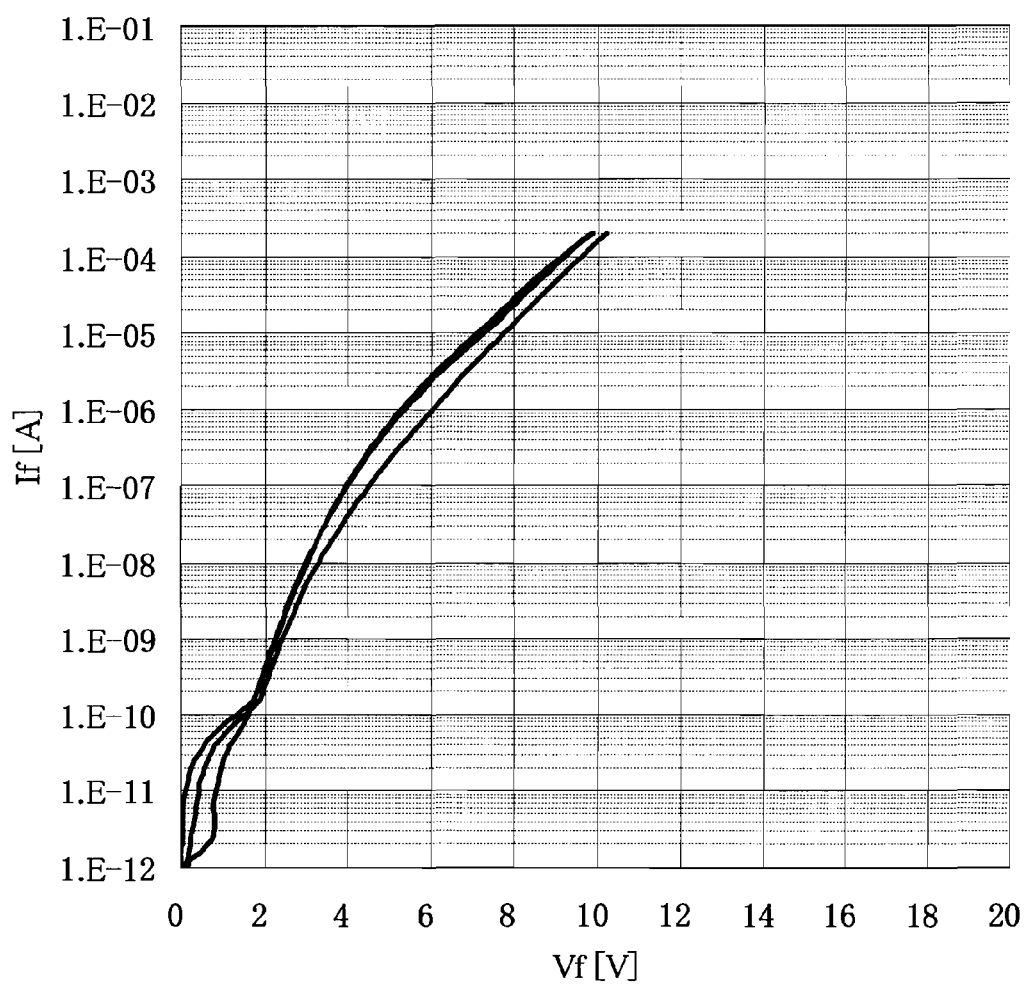
FIG. 7 is a graph showing the forward voltage-current characteristic of the semiconductor light emitting element shown in FIG. 1.
Figure 8:
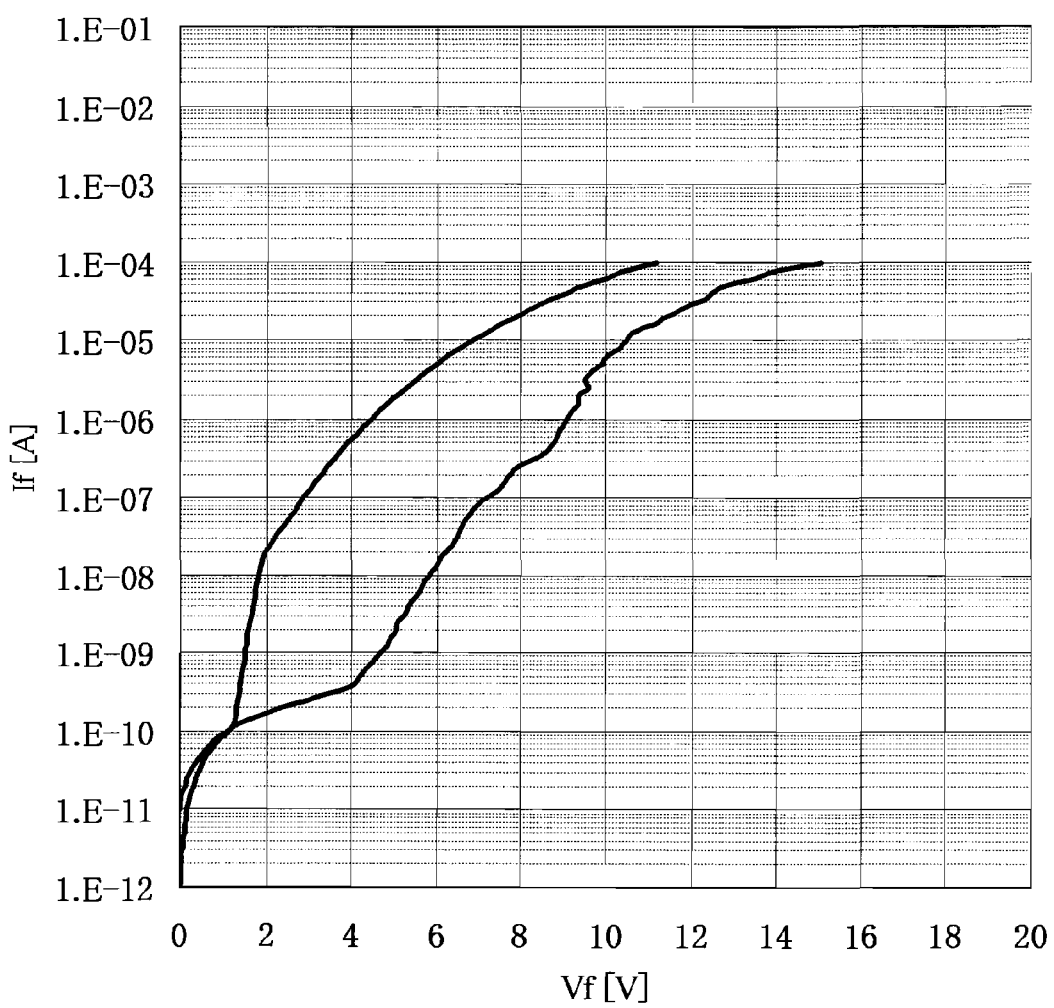
FIG. 8 is a graph showing the forward voltage-current characteristic of the comparative example 2.

FIG. 7 shows the forward current If relative to the forward voltage Vf (Vf-If characteristic) of the semiconductor light emitting element A, which was measured a plurality of times. Specifically, with measurement probes fixed to predetermined positions of the n-side electrode 5 and the p-side electrode 6, the forward current If was measured while changing the forward voltage Vf (first measurement). Then, after the positions of the probes were changed, the measurement was performed in the same manner (second measurement). Then, after the positions of the probes were changed again, the measurement was performed in the same manner (third measurement). As shown in the figure, there are almost no variations in the three measurement results of the Vf-If characteristic. The same measurement was performed with respect to the comparative example 2, and the results are shown in FIG. 8. In the comparative example 2, the Vf-If characteristic varied largely when the positions of the measurement probes were changed. Conceivably, the reason for this difference is that the Ni layers 52 and 62 of the semiconductor light emitting element A are hardly damaged by etching, and hence, the surfaces of the p-side electrode 5 and the n-side electrode 6 are entirely smooth.

The bonding of the n-side electrode 5 and the p-side electrode 6 to the wiring 8 is achieved by the bonding of the Ni layers 52, 62 to the Ni layer 81. Such bonding of the members made of the same material is suitable for reducing the resistance at the bonding portions, as compared with the bonding of the members made of different kinds of metals, and hence, advantageous for reducing the drive voltage of the semiconductor light emitting element A.

The Al layer 51 of the n-side electrode 5 can easily form an ohmic contact with the n-GaN layer 2. Further, the Au layer 61 of the p-side electrode 6 can easily form an ohmic contact with the p-GaN layer 4. This is also advantageous for reducing the drive voltage of the semiconductor light emitting element A.

Figure 9:
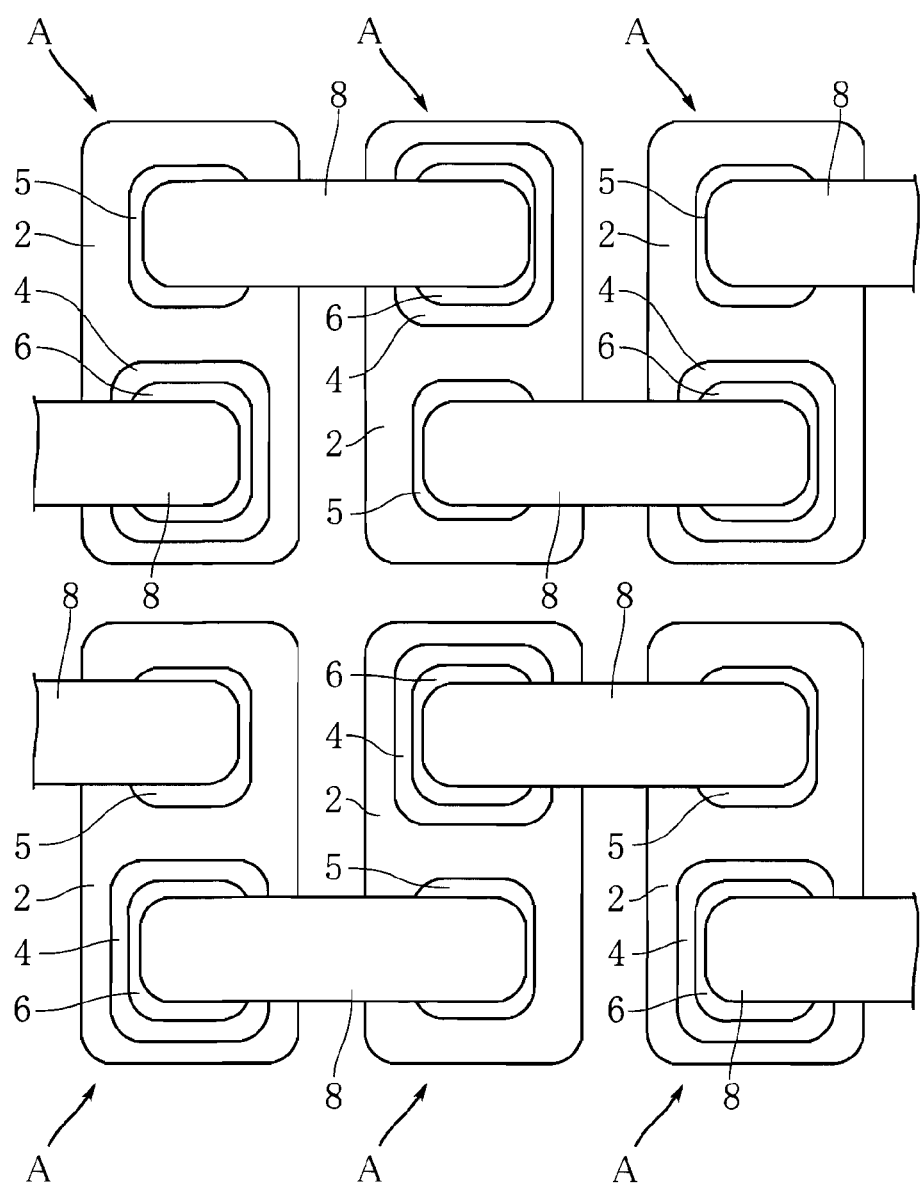
FIG. 9 is a plan view showing a principal portion of an illuminator using the semiconductor light emitting element shown in FIG. 1.

FIG. 9 shows an example of illuminator using the semiconductor light emitting element A. In this illuminator, a plurality of semiconductor light emitting elements A are arranged in a matrix. In this figure, the illustration of the substrate 1 and the insulating substrate 7 shown in FIG. 1 is omitted. Adjacent ones of the semiconductor light emitting elements A arranged in a matrix are connected to each other via a wiring 8. In this embodiment, the n-side electrode 5 of each semiconductor light emitting element A is connected to the p-side electrode 6 of the adjacent semiconductor light emitting element A. Thus, the semiconductor light emitting elements A are connected in series to each other. The illuminator having this structure is capable of performing surface emission at a low drive voltage, while preventing leakage current.

The invention claimed is:

1. A set of semiconductor light emitting elements arranged in a matrix, each of the light emitting elements comprising:
    an n-type semiconductor layer and a p-type semiconductor layer;
    an active layer disposed between the n-type semiconductor layer and the p-type semiconductor layer;
    an n-side electrode contacting the n-type semiconductor layer;
    a p-side electrode contacting the p-type semiconductor layer; and
    an insulating layer covering the n-type semiconductor layer and the p-type semiconductor layer in a manner such that part of the n-side electrode and part of the p side electrode is exposed;
    wherein the n-side electrode comprises a first layer made of Al and contacting the n-type semiconductor layer, and a second layer formed on the first layer and made of any one of Ni, W, Zr and Pt;
    wherein the p-side electrode comprises a first layer made of Au and contacting the p-type semiconductor layer, and a second layer formed on the first layer and made of any one of Ni, W, Zr and Pt;
    wherein a wiring formed directly on the insulating layer connects the n-side electrode of each light emitting element to the p-side electrode of an adjacent light emitting element; and
    wherein the wiring includes a first layer and a second layer formed on the first layer, the first layer of the wiring contacting the second layer of the n-side electrode and the second layer of the p-side electrode, the first layer of the wiring being made of a same material as that of the second layers of the n-side electrode and that of the p-side electrode.

2. The semiconductor light emitting element according to claim 1, wherein the second layer of the wiring is made of Au.

* * * * *